US012568823B2

(12) United States Patent
Mun et al.

(10) Patent No.: US 12,568,823 B2
(45) Date of Patent: Mar. 3, 2026

(54) SEMICONDUCTOR PACKAGE STRUCTURE

(71) Applicant: Samsung Electronics Co., Ltd.,
Suwon-si (KR)

(72) Inventors: Kyung Don Mun, Suwon-si (KR);
Geun Woo Kim, Suwon-si (KR);
Tae-Young Lee, Suwon-si (KR)

(73) Assignee: Samsung Electronics Co., Ltd.,
Gyeonggi-do (KR)

( * ) Notice: Subject to any disclaimer, the term of this
patent is extended or adjusted under 35
U.S.C. 154(b) by 268 days.

(21) Appl. No.: 18/361,099

(22) Filed: Jul. 28, 2023

(65) Prior Publication Data

US 2024/0047303 A1 Feb. 8, 2024

(30) Foreign Application Priority Data

Aug. 8, 2022 (KR) ......................... 10-2022-0098305

(51) Int. Cl.
H01L 23/46 (2006.01)
H01L 23/00 (2006.01)
(Continued)

(52) U.S. Cl.
CPC .......... H01L 23/46 (2013.01); H01L 23/3185
(2013.01); H01L 23/49822 (2013.01); H01L
23/5383 (2013.01); H01L 23/552 (2013.01);
H01L 24/08 (2013.01); H01L 25/0655
(2013.01); H01L 2224/08235 (2013.01); H01L
2924/1431 (2013.01);
(Continued)

(58) Field of Classification Search
CPC ..... H01L 23/00; H01L 23/31; H01L 23/3185;
H01L 23/42; H01L 23/44; H01L 23/46;
H01L 23/498; H01L 23/49822; H01L
23/5383; H01L 23/538; H01L 23/5385;
H01L 23/552; H01L 24/08; H01L 24/16;
H01L 25/065; H01L 25/0652; H01L
25/0655; H01L 2224/08146; H01L
2224/08235; H01L 2924/1431; H01L
2924/1436; H01L 2924/1437; H01L
2924/1438
See application file for complete search history.

(56) References Cited

U.S. PATENT DOCUMENTS 7,358,201 B2 4/2008 Ramanathan et al.
10,943,851 B1 3/2021 Elsherbini et al.
(Continued)

*Primary Examiner* — Brook Kebede
(74) *Attorney, Agent, or Firm* — Harness, Dickey &
Pierce, P.L.C.

(57) ABSTRACT

A semiconductor package structure include a silicon substrate, a plurality of dies on the silicon substrate, a mold layer between the plurality of dies, a metal layer covering an upper side of the mold layer and at least a part of upper sides of each of the plurality of dies, and including an opening that exposes a part of the upper side of at least one die among the plurality of dies, and a temperature controller configured to control a temperature of the plurality of dies, the temperature controller including a body defining a circulation region configured to circulate a fluid for controlling the temperature of the plurality of dies, and a passage part configured to allow the fluid to flow into or out of the circulation region, and the fluid in the circulation region being in direct contact with exposed upper sides of the plurality of dies.

20 Claims, 17 Drawing Sheets

(51) Int. Cl.

| | |
|---|---|
| *H01L 23/31* | (2006.01) |
| *H01L 23/498* | (2006.01) |
| *H01L 23/538* | (2006.01) |
| *H01L 23/552* | (2006.01) |
| *H01L 25/065* | (2023.01) |

(52) U.S. Cl.
CPC ................. *H01L 2924/1436* (2013.01); *H01L 2924/1437* (2013.01); *H01L 2924/1438* (2013.01)

(56) References Cited

U.S. PATENT DOCUMENTS

| | | | |
|---|---|---|---|
| 10,964,624 B2 | 3/2021 | Gutala et al. | |
| 10,964,625 B2 * | 3/2021 | Jain ....................... | H01L 23/367 |
| 10,966,352 B2 * | 3/2021 | Iyengar ................. | H01L 23/427 |
| 11,139,223 B2 | 10/2021 | Yu et al. | |
| 11,282,766 B2 | 3/2022 | Ku et al. | |
| 2007/0230130 A1 * | 10/2007 | Alcoe ................. | H01L 23/3735 |
| | | | 257/E23.09 |
| 2020/0176352 A1 | 6/2020 | Chang et al. | |
| 2021/0108860 A1 * | 4/2021 | Kulkarni ............. | F28D 15/0233 |
| 2021/0167051 A1 | 6/2021 | Yu et al. | |
| 2021/0320048 A1 | 10/2021 | Limaye et al. | |

* cited by examiner

SEMICONDUCTOR PACKAGE STRUCTURE

CROSS-REFERENCE TO RELATED APPLICATION

This application claims priority to Korean Patent Application No. 10-2022-0098305 filed on Aug. 8, 2022 in the Korean Intellectual Property Office, and all the benefits accruing therefrom under 35 U.S.C. 119, the contents of which in its entirety are herein incorporated by reference.

BACKGROUND

1. Field of the Disclosure

The present disclosure relate to semiconductor package structures. More specifically, the present disclosure relate to semiconductor package structures which includes a metal layer that partially exposes an upper side of a die, and includes a temperature controller that directly controls the temperature of the die through the exposed upper side of the die.

2. Description of the Related Art

Electronic products are constantly getting smaller and a higher performance is required at the same time. In existing 2D, 2.5D, and 3D packages, products having ultra-high performance of a wafer scale state are being developed. In addition, the possibility of active adoption of wafer scale products in various industries is also emerging.

In a wafer scale package system, a significant heat may be generated in a plurality of dies mounted inside the package. The heat generated in the plurality of dies may degrade the performance of the overall package system, and may degrade the reliability of the overall package system. Therefore, researches which try to improve a transmission rate of data and the reliability of the wafer scale package system by directly introducing a method capable of effectively cooling the plurality of dies into the wafer scale package system are being actively conducted.

SUMMARY

Example embodiments of the present disclosure provides semiconductor package structures having improved product performance However, Example embodiments of the present disclosure are not restricted to the one set forth herein. The above and other aspects of the present disclosure will become more apparent to one of ordinary skill in the art to which the present disclosure pertains by referencing the detailed description of the present disclosure given below.

According to some example embodiments of the present disclosure, there is provided a semiconductor package structure including, a silicon substrate, a plurality of dies on the silicon substrate, a mold layer between the plurality of dies, a metal layer covering an upper side of the mold layer and at least a part of upper sides of each of the plurality of dies, the mold layer including an opening exposing a part of the upper side of at least one die among the plurality of dies, and a temperature controller configured to control the temperature of the plurality of dies, on the mold layer, the temperature controller including a body which defines a circulation region configured to circulate a fluid for controlling the temperature of the plurality of dies, and a passage part configured to allow the fluid to flow into or out of the circulation region, and the fluid in the circulation region being in direct contact with exposed upper sides of the plurality of dies.

According to some example embodiments of the present disclosure, there is provided a semiconductor package structure including, a silicon substrate which has a circular shape from a planar viewpoint, and includes a center region and an edge region that surrounds the center region, a mold layer on a front side of the silicon substrate, and including a plurality of trenches in the center region of the silicon substrate, a plurality of dies placed inside the trench, a metal layer covering the mold layer, and including an opening that exposes a part of the upper sides of the plurality of dies, and a temperature controller which is placed on the silicon substrate and is configured to control a temperature of the plurality of dies, the temperature controller including an adhesive layer attached to the metal layer and placed along an edge region of the silicon substrate, a body connected to the adhesive layer, defining a circulation region configured to circulate a fluid for controlling the temperature of the plurality of dies, and has a columnar shape, and a passage part on a top wall of the body, and is configured to allow the fluid to flow into or out of the circulation region, and the fluid in the circulation region being in direct contact with the upper sides of the plurality of dies to control the temperature of the plurality of dies.

According to some example embodiments of the present disclosure, there is provided a semiconductor package structure including, a circuit board, a silicon substrate electrically connected to the circuit board, the silicon substrate having a circular shape from a planar viewpoint, including a center region and an edge region that surrounds the center region, and being formed of silicon (Si), a mold layer on a front side of the silicon substrate, and including a plurality of trenches in the center region of the silicon substrate, a redistribution pattern between the silicon substrate and the mold layer, a plurality of dies inside the trenches, and include chip pads bonded to the redistribution patterns, a metal layer which covers the mold layer, the metal layer exposing at least a part of upper sides of the plurality of dies, and including an opening having a width smaller than the width of the dies, and a temperature controller on the silicon substrate and configured to control the temperature of the plurality of dies, the temperature controller including an adhesive layer attached to the metal layer and placed along an edge region of the silicon substrate, a body which includes a side wall and a top wall having a columnar shape, and defines a circulation region configured to circulate a fluid for controlling the temperature of the plurality of dies, the side wall of the body being connected to the adhesive layer, and a passage part which is formed on the top wall of the body and is configured to allow the fluid to flow into or out of the circulation region, the fluid in the circulation region being in direct contact with upper sides of the plurality of dies to control the temperature of the plurality of dies, and the upper sides of each of the plurality of dies and the upper side of the mold layer are placed on the same plane.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION

A semiconductor package structure according to some example embodiments will be described below with reference to FIGS. 1 to 4.

Figure 1:
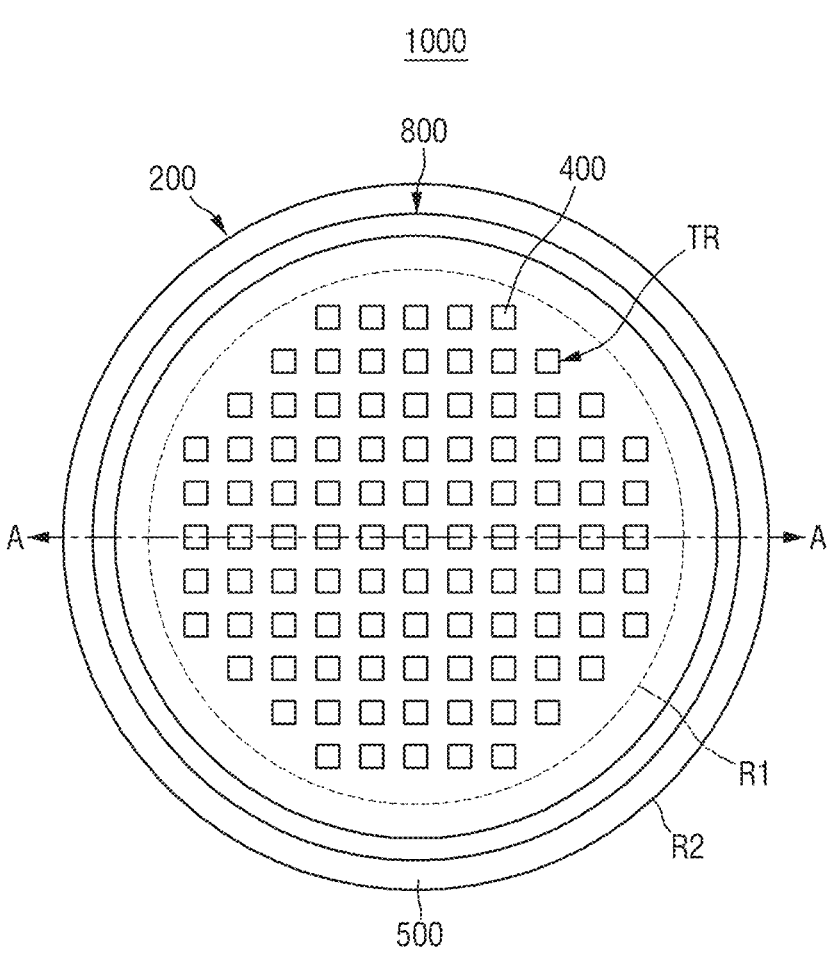
FIG. 1 is an exemplary plan view for explaining a semiconductor package structure according to some example embodiments.
Figure 2:
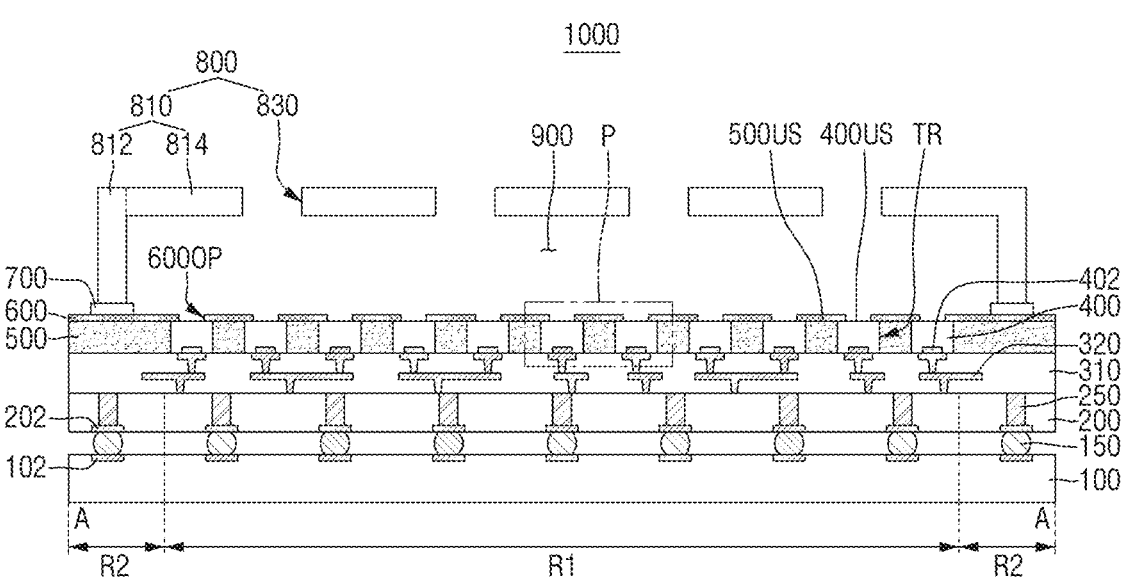
FIG. 2 is a cross-sectional view taken along a line A-A of FIG. 1.

FIG. 1 is an exemplary plan view for explaining a semiconductor package structure according to some example embodiments. FIG. 2 is a cross-sectional view taken along a line A-A of FIG. 1.

First, referring to FIGS. 1 and 2, a semiconductor package structure 1000 according to some example embodiments may include a circuit board 100, a silicon substrate 200, a redistribution substrate 310, a plurality of dies 400, a mold layer 500, a metal layer 600, an adhesive layer 700, and a temperature controller 800.

The circuit board 100 may be a packaging substrate. The circuit board 100 may be a printed circuit board (PCB). The circuit board 100 may include a lower side and an upper side that are opposite to each other. The upper side of the circuit board 100 may face the silicon substrate 200.

The circuit board 100 may include first substrate pads 102. The first substrate pads 102 may be used to electrically connect the circuit board 100 with other constituent elements. For example, the first substrate pads 102 may be exposed from the upper side of the circuit board 100. The first substrate pads 102 may be connected to connection terminals 150, which will be described below. The circuit board 100 and the silicon substrate 200 may be electrically connected through the first substrate pads 102 and the connection terminals 150. The first substrate pads 102 may include, but not limited to, metal materials such as copper (Cu) or aluminum (Al).

In some example embodiments, wiring patterns may be formed inside the circuit board 100. Although the circuit board 100 is shown as a single film, this is only for convenience of explanation. For example, it goes without saying that the circuit board 100 may be made up of multiple layers, and wiring patterns of multiple layers may be formed therein.

The circuit board 100 may be mounted on a mother board or the like of an electronic device. Although not shown, the circuit board 100 may be mounted on the mother board or the like of the electronic device through connection terminals provided on the lower side. The circuit board 100 may be, but not limited to, a BGA (Ball Grid Array) board.

In some example embodiments, the circuit board 100 may include a CCL (Copper Clad Laminate). For example, the circuit board 100 may have a structure in which a copper laminate is stacked on a single side or on both sides of a thermoset pre-preg (e.g., C-stage pre-preg).

The silicon substrate 200 may be placed on the circuit board 100. The silicon substrate 200 may be formed of silicon (Si). The silicon substrate 200 may include a lower side and an upper side opposite to each other. The lower side of the silicon substrate 200 may face the circuit board 100. The upper side of the silicon substrate 200 may face the plurality of dies 400.

In some example embodiments, the silicon substrate 200 may have a circular shape from a planar viewpoint. The silicon substrate 200 may include a first region R1 and a second region R2. The second region R2 may surround the first region R1. As an example, the first region R1 may be a center region. The second region R2 may be an edge region. In FIG. 1, an adhesive layer 700 may be placed on the edge region R2. The plurality of dies 400 may be placed on the center region R 1.

The silicon substrate 200 may be electrically connected to the circuit board 100. For example, the silicon substrate 200 and the circuit board 100 may be electrically connected to each other through the first substrate pads 102 and the second substrate pads 202.

The silicon substrate 200 may include the second substrate pads 202. The second substrate pads 202 may be used to electrically connect the silicon substrate 200 with other constituent elements. For example, the second substrate pads 202 may be exposed from the lower side of the silicon substrate 200. The second substrate pads 202 may be connected with the connection terminals 150. The circuit board 100 and the silicon substrate 200 may be electrically connected through the second substrate pads 202 and the connection terminals 150. The second substrate pads 202 may include, for example, but not limited to, metal materials such as copper (Cu) and/or aluminum (Al).

The connection terminals 150 may be placed between the circuit board 100 and the silicon substrate 200. The connection terminals 150 may be placed between the circuit board 100 and the silicon substrate 200 to electrically connect the circuit board 100 and the silicon substrate 200. The connection terminals 150 may be connected to the first substrate pads 102 and the second substrate pads 202.

The connection terminals 150 may be, but not limited to, solder bumps including low-melting point metals, for example, tin (Sn) and/or tin (Sn) alloys. The connection terminals 150 may have various shapes such as a land, a ball, a pin, and a pillar. The connection terminal 150 may be formed of a single layer or multiple layers. When the connection terminal 150 is formed of the single layer, the connection terminal 150 may include, for example, tin-silver (Sn—Ag) solder and/or copper (Cu). When the connection terminal 150 is formed of the multiple layers, the connection terminal 150 may include, for example copper (Cu) filler and solder. Of course, the number, interval, placement form, and the like of the connection terminals 150 are not limited to those shown in the drawings, and may vary depending on the design.

In some example embodiments, through vias 250 may be placed inside the silicon substrate 200. The through vias 250 may penetrate the silicon substrate 200. The through vias 250 may be connected to the second substrate pads 202. The silicon substrate 200 and the plurality of dies 400 may be electrically connected through the through vias 250. The through vias 250 may include a conductive material. For example, the through vias 250 may include, but not limited to, metal materials such as copper (Cu) and/or aluminum (Al).

Although not shown, a transistor may be formed on the upper side of the silicon substrate 200. The transistor may be electrically connected to the plurality of dies 400. The transistor may control the plurality of dies 400. When the transistor is formed on the upper side of the silicon substrate 200, an active region may be formed inside the silicon substrate 200.

The redistribution substrates 310 may be placed on the upper side of the silicon substrate 200. The redistribution substrates 310 may each be made of a photoimageable dielectric. For example, the redistribution substrate 310 may include a photoimageable polymer. The photoimageable polymer may be formed of at least one of, for example, photoimageable polyimide, polybenzoxazole, phenolic polymer, and benzocyclobutene-based polymer. As another example, the redistribution substrates 310 may be formed of a silicon oxide film, a silicon nitride film or a silicon oxynitride film. As still another example, the redistribution substrate 310 may include organic materials. The redistribution substrate 310 may include pre-preg. The pre-preg may be a composite fiber in which reinforcing fibers such as carbon fiber, glass fiber or aramid fiber are impregnated with a thermosetting polymer binder (e.g., epoxy resin) or thermoplastic resin in advance.

In some example embodiments, redistribution pattern 320 may be placed inside the redistribution substrate 310. The redistribution patterns placed at the highest level among the redistribution patterns 320 may be bonded to the chip pad 402. The redistribution patterns 320 may be electrically connected to the die 400 through the chip pad 402. The redistribution patterns 320 may include a conductive material. For example, the redistribution patterns 320 may include, but not be limited to, copper (Cu). When the redistribution patterns 320 and the chip pad 402 are each formed of copper (Cu), the bonding type may be a Cu—Cu bonding type, and the redistribution patterns 320 and the chip pad 402 may be formed of aluminum (Al) and/or tungsten (W), respectively.

The mold layer 500 may be placed on a front side of the silicon substrate 200. That is, the mold layer 500 may also have a circular shape from the planar viewpoint. The mold layer 500 may be placed on the redistribution substrate 310 and the redistribution patterns 320. The mold layer 500 may include a plurality of trenches TR. The plurality of trenches TR may expose the upper side of the redistribution substrate 310 respectively. The plurality of trenches TR may be formed in a center region R1 of the silicon substrate 200. The plurality of trenches TR may not be formed in the edge region R2 of the silicon substrate 200.

The mold layer 500 may be placed between the plurality of dies 400. The mold layer 500 may separate the plurality of dies 400 from each other. The mold layer 500 may include, but not limited to, an insulating polymeric material such as an EMC.

The plurality of dies 400 may be placed on the silicon substrate 200. The plurality of dies 400 may be placed in the center region R1 of the silicon substrate 200. The plurality of dies 400 may not be placed in the edge region R2 of the silicon substrate 200. The plurality of dies 400 may be placed inside the trenches TR. The plurality of dies 400 may be placed between the mold layers 500. Each of the plurality of dies 400 may be separated from each other by the mold layers 500.

In some example embodiments, the plurality of dies 400 may be an integrated circuit (IC) in which hundreds to millions of or more semiconductor elements are integrated in a single chip. For example, the plurality of dies 400 may each include at least one of a memory chip and a logic chip. The logic chip may be, but not limited to, an application processor (AP), such as a CPU (Central Processing Unit), a GPU (Graphic Processing Unit), an FPGA (Field-Programmable Gate Array), a digital signal processor, an encryption processor, a micro processor, a micro controller, and an ASIC (Application-Specific IC). The memory chip may be a volatile memory such as a DRAM (dynamic random access memory) or a SRAM (static random access memory), or a non-volatile memory such as a flash memory, a PRAM (phase-change random access memory), a MRAM (Magnetoresistive Random Access Memory), a FeRAM (Ferroelectric Random Access Memory) or a RRAM (Resistive Random Access Memory).

As an example, some of the plurality of dies 400 may be an ASIC such as a GPU, and others of the plurality of dies 400 may be a stacked memory, such as a high bandwidth memory (HBM). Such a stack memory may have a form in which a plurality of integrated circuits are stacked. The stacked integrated circuits may be electrically connected to each other through a TSV (Through Silicon Via) or the like.

The plurality of dies 400 may each include a chip pad 402. The chip pad 402 may be used to electrically connect the plurality of dies 400 with other constituent elements. For example, the chip pads 402 may be exposed from the lower side of the die 400. The chip pad 402 may be bonded with the redistribution patterns 320. The chip pad 402 may include a conductive material. For example, the chip pads 402 may be formed of copper (Cu). If the chip pad 402 is formed of copper (Cu), the redistribution pattern 320 and the chip pad 402 may be bonded to each other by the Cu—Cu bonding type.

A metal layer 600 may be placed on the mold layer 500 and the plurality of dies 400. The metal layer 600 may extend along an upper side 500US of the mold layer 500 and upper sides 400US of the plurality of dies 400. The metal layer 600 may completely cover the upper side 500US of the mold layer 500. The metal layer 600 may not completely cover the upper sides 400US of the plurality of dies 400.

In some example embodiments, the metal layer 600 may include openings 600OP. The openings 600OP may expose some of the upper sides 400US of the plurality of dies 400. That is, some of the upper sides 400US of the plurality of dies 400 may be exposed, and others thereof may be covered with the metal layer 600. Since some of the upper sides 400US of the dies 400 are exposed, the temperature of the dies 400 can be effectively controlled.

The metal layer 600 may include a conductive material. For example, the metal layer 600 may be formed of copper (Cu), nickel (Ni), aluminum (Al), and combinations thereof. Preferably, the metal layer 600 may be formed of, but not limited to, copper (Cu).

An adhesive layer 700 may be formed on the metal layer 600. The adhesive layer 700 may be placed along the edge region R2 of the silicon substrate 200. The adhesive layer 700 may include an adhesive material. For example, the adhesive layer 700 may include a curable polymer. The adhesive layer 700 may include, for example, an epoxy-based polymer.

The temperature controller 800 may be placed on the silicon substrate 200. The temperature controller 800 may cover the center region R1 of the silicon substrate 200. The temperature controller 800 may control the temperature of the plurality of dies 400. For example, the temperature controller 800 may cool the plurality of dies 400.

In some example embodiments, the temperature controller 800 may include a body 810 and a passage part 830.

The body 810 may have a columnar shape. The body 810 may define a circulation region 900. The circulation region 900 may be a region in which fluid circulates. The fluid may be circulated inside the circulation region 900 to control the temperature of the plurality of dies 400.

The body 810 may include a side wall 812 and a top wall 814. The side wall 812 of the body 810 may be attached to the adhesive layer 700. The side wall 812 of the body 810 may extend in a vertical direction. The side wall 812 of the body 810 may be placed on the edge region R2 of the silicon substrate 200. The vertical direction may be a direction that is perpendicular to the upper side of the silicon substrate 200.

The top wall 814 of the body 810 may be connected to the side wall 812 of the body 810. The top wall 814 of the body 810 may extend in a horizontal direction. The horizontal direction may be a direction that is parallel to the upper side of the silicon substrate 200. The top wall 814 of the body 810 may cover the center region R1 of the silicon substrate 200. The top wall 814 of the body 810 may cover the plurality of dies 400.

The passage part 830 may be formed on the top wall 814 of the body 810. Fluid may be supplied to the circulation region 900 through the passage part 830. In some example embodiments, at least some of the passage part 830 may vertically overlap the exposed upper side 400US of the die 400. In some example embodiments, at least some of the passage part 830 may vertically overlap the opening 600OP of the metal layer 600. Preferably, the passage part 830 through which the fluid is supplied may vertically overlap the exposed upper side 400US of the die 400. The fluid may also be discharged through the passage part 830. Although not shown, a tube connected to the passage part 830 may be placed. The fluid may be supplied or discharged through the tube.

Figure 3:
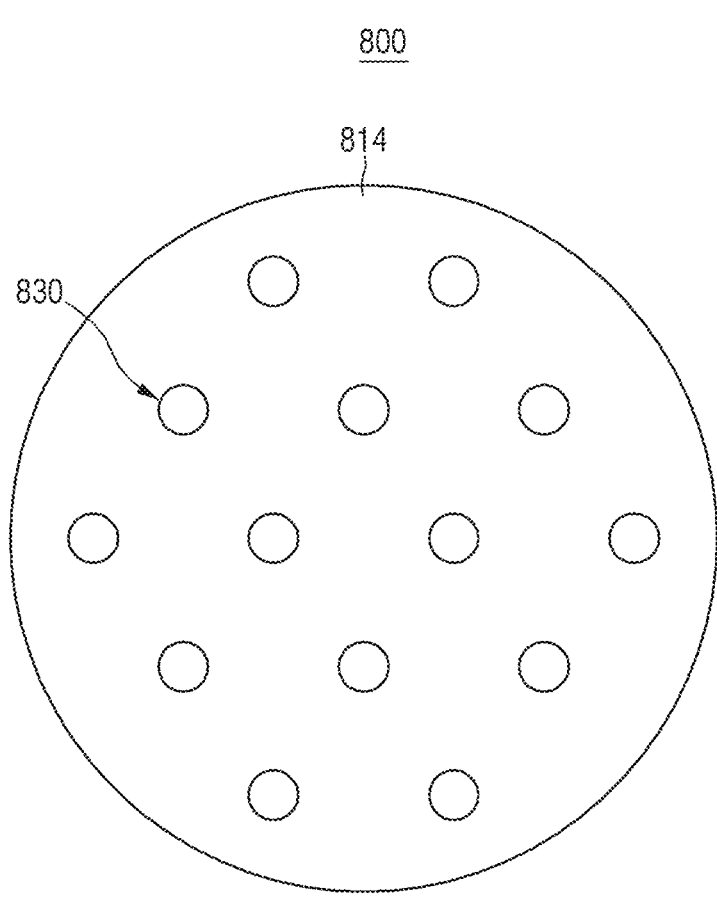
FIG. 3 is a plan view for explaining the temperature controller of FIG. 2.

FIG. 3 is a plan view for explaining the temperature controller of FIG. 2.

Referring to FIG. 3, the passage part 830 may be formed on the top wall 814 of the body 810. The passage part 830 may be formed on the top wall 814 of the body 810 at regular intervals. The placement, interval, number, size, and the like of the passage part 830 may vary depending on the design of the product.

In FIG. 3, some of the passage parts 830 may be passages through which fluid is supplied. Others of the passage parts 830 may be passages through which fluid is discharged. As an example, the passage part 830 placed on the outside of the top wall 814 may be used as a passageway into which the fluid is supplied, and the passage part 830 placed at the center of the top wall 814 may be used as a passageway from which the fluid is discharged. As another example, the passage part 830 placed on the outside of the top wall 814 may be used as a passageway from which the fluid is discharged, and the passage part 830 placed at the center of the top wall 814 may be used as a passageway into which the fluid is supplied.

Figure 4:
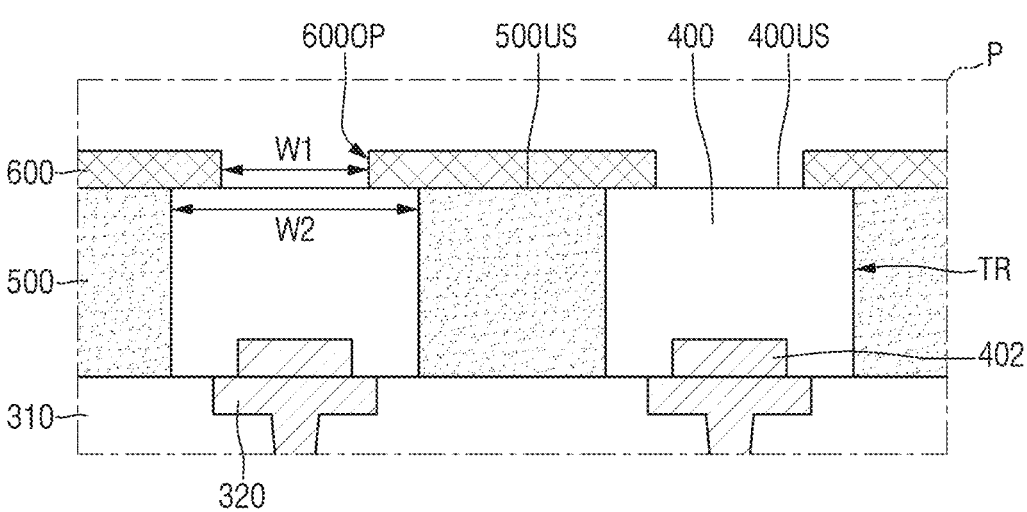
FIG. 4 is an enlarged view of a region P of FIG. 2.

FIG. 4 is an enlarged view of a region P of FIG. 2. Referring to FIG. 4, the mold layer 500, the die 400, and the metal layer 600 will be described in more detail.

Referring to FIG. 4, the metal layer 600 extends along the upper side 500US of the mold layer 500 and the upper side 400US of the die 400. The upper side 500US of the mold layer 500 and the upper side 400US of the die 400 may be placed on the same plane. The metal layer 600 completely covers the upper side 500US of the mold layer 500, but does not completely cover the upper side 400US of the die 400.

For example, the metal layer 600 includes an opening 600OP that exposes a part of the upper side 400US of the die 400. The metal layer 600 covers a part of the upper side 400US of the die 400 and exposes another part of the upper side 400US of the die 400. The opening 600OP has a first width W1. The die 400 has a second width W2. The first width W1 may be less than the second width W2, but is not limited thereto.

Because the metal layer 600 has a structure which partially covers the upper side 400US of the die 400, the mold layer 500 may be protected. For example, the fluid may be supplied to the circulation region 900, and the temperature of the die 400 may be cooled by the fluid. Since the first width W1 is less than the second width W2, the fluid may not penetrate the mold layer 500.

Figure 5:
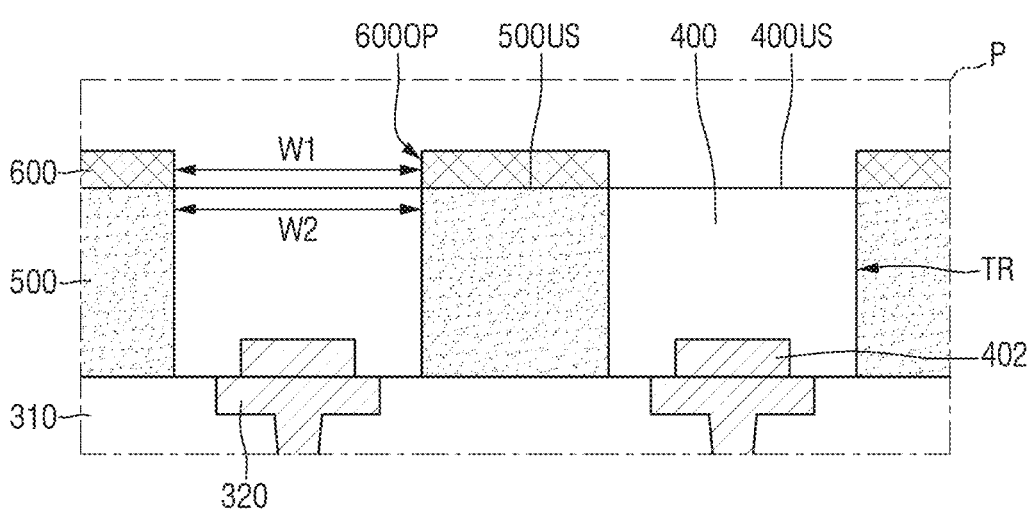
FIGS. 5 and 6 are diagrams for explaining a semiconductor package structure according to some example embodiments.
Figure 6:
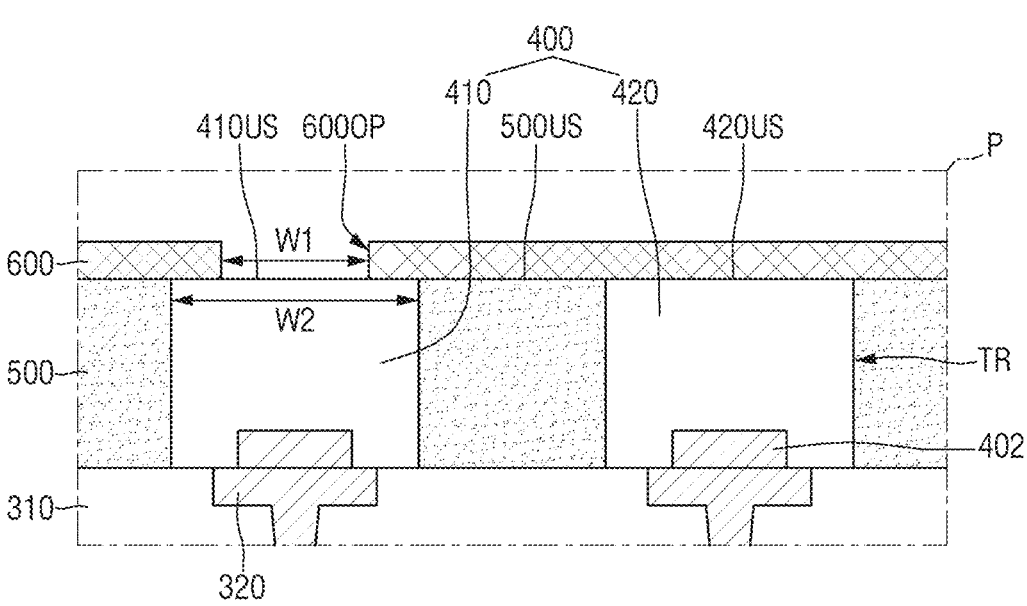

FIGS. 5 and 6 are diagrams for explaining a semiconductor package structure according to some example embodiments. For convenience of explanation, the explanation will be mainly provided on points that are different from those explained using FIG. 4.

First, referring to FIG. 5, the first width W1 may be the same as the second width W2. The metal layer 600 does not completely cover the upper side 400US of the die 400. The metal layer 600 completely covers the upper side 500US of the mold layer 500. The width of the exposed upper side 400US of the die 400 may be maximum exposed area by the metal layer 600. Since the width of the exposed upper side 400US of the die 400 is maximum width of the die 400, the temperature of the die 400 can be controlled most effectively.

Referring to FIG. 6, the metal layer 600 may completely cover the upper sides 400US of some of the plurality of dies 400.

For example, plurality of dies 400 may include a first die 410 and a second die 420. The first die 410 and the second die 420 may be dies adjacent to each other, or may be dies spaced apart from each other.

The metal layer 600 may cover some of the upper sides 410US of the first die 410. The opening 600OP may expose some of the upper side 410US of the first die 410. The first width W1 of the opening 600OP may be smaller than the second width W2 of the first die 410, but is not limited thereto.

The metal layer 600 may completely cover the upper side 420US of the second die 420. The upper side 420US of the second die 420 is not exposed. The opening 600OP is not formed on the upper side 420US of the second die 420. Some dies among the plurality of dies 400 may require electromagnetic wave shielding. The dies that require the electromagnetic wave shielding may be completely covered with the metal layer 600 on the upper side, like the second die 420. That is, the upper sides of some of the plurality of dies 400 may be completely covered with the metal layer 600, depending on the product design.

FIGS. 7A to 7E are cross-sectional views sequentially showing processes for fabricating the semiconductor package structure having the cross-section of FIG. 2. A method for fabricating the semiconductor package structure according to some example embodiments will be described referring to FIGS. 7A to 7E.

Figure 7A:
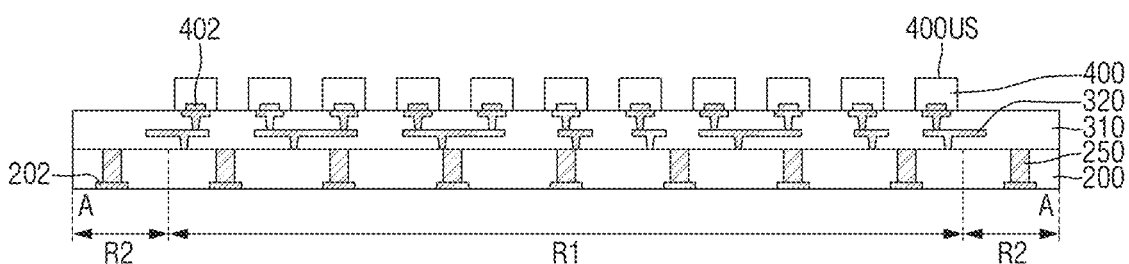
FIGS. 7A to 7E are cross-sectional views sequentially showing processes for fabricating the semiconductor package structure having the cross-section of FIG. 2.

Referring to FIG. 7A, the silicon substrate 200 may be provided. A second substrate pad 202 may be formed inside the silicon substrate 200. The second substrate pad 202 may expose the lower side of the silicon substrate 200. Through vias 250 may be formed inside the silicon substrate 200. The through vias 250 may penetrate the silicon substrate 200 and be connected with the second substrate pads 202.

The redistribution substrate 310 may be formed on the silicon substrate 200. The redistribution patterns 320 may be formed inside the redistribution substrate 310. The plurality of dies 400 may be mounted on the redistribution substrate 310. The plurality of dies 400 may be mounted on the center region R1 of the silicon substrate 200. Each of the plurality of dies 400 may include a chip pad 402. The chip pad 402 may be bonded to the redistribution patterns 320. That is, the plurality of dies 400 may be electrically connected to the redistribution pattern 320.

Figure 7B:
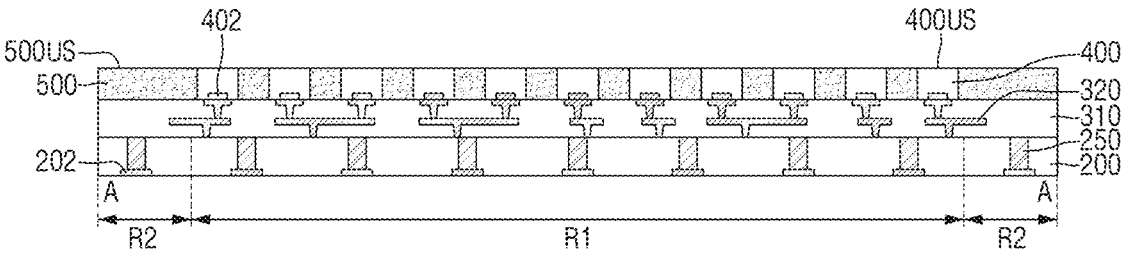

Referring to FIG. 7B, the mold layer 500 may be formed on the silicon substrate 200. Although not shown, a pre-mold layer that covers the plurality of dies 400 may be formed on the redistribution substrate 310. The pre-mold layer may then be etched to form the mold layer 500. The pre-mold layer may include, but not limited to, an insulating polymeric material such as an EMC.

The mold layer 500 may be filled between the plurality of dies 400. The mold layer 500 may separate the plurality of dies 400 from each other. The mold layer 500 may include a trench TR. The plurality of dies 400 may be placed inside the trench TR. The trench TR may be formed in the center region R1 of the silicon substrate 200.

In some example embodiments, the upper side 500US of the mold layer 500 may be placed on the same plane as the upper side 400US of the die 400, but is not limited thereto.

Figure 7C:
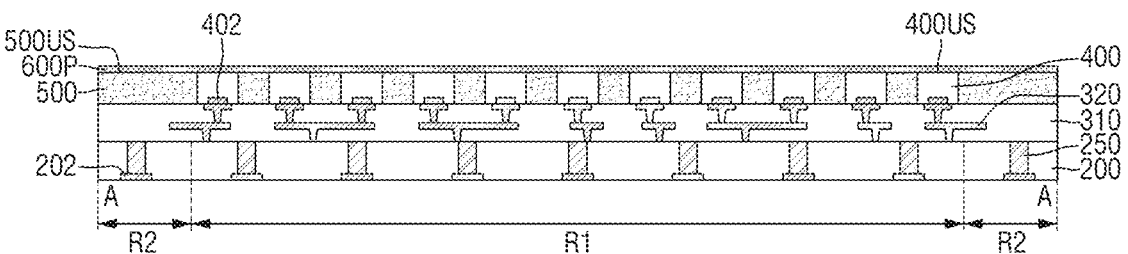

Referring to FIG. 7C, a pre-metal layer 600P extending along the upper side 500US of the mold layer 500 and the upper side 400US of the die 400 may be formed. The pre-metal layer 600P may be formed conformally, but not limited thereto. The pre-metal layer 600P may completely cover the upper side 500US of the mold layer 500 and the upper side 400US of the die 400. The pre-metal layer 600P may include a conductive material. For example, the pre-metal layer 600P may be formed of copper (Cu), nickel (Ni), aluminum (Al), and/pr combinations thereof. Preferably, the pre-metal layer 600P may be formed of, but not limited to, copper (Cu).

Figure 7D:
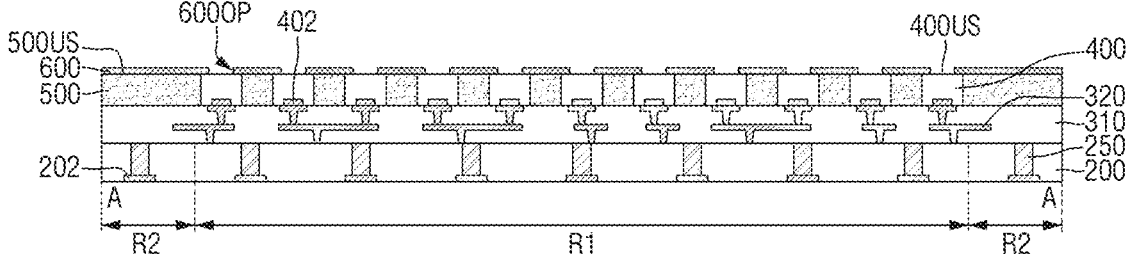

Referring to FIG. 7D, a part of the pre-metal layer 600P may be etched to form a metal layer 600. A part of the pre-metal layer 600P may be etched to form an opening 600OP. The opening 600OP may expose a part of the upper side 400US of the die 400. The metal layer 600 may expose a part of the upper side 400US of the die 400. The metal layer 600 may cover a part of the upper side 400US of the die 400. The metal layer 600 may completely cover the upper side 500US of the mold layer 500.

Figure 7E:
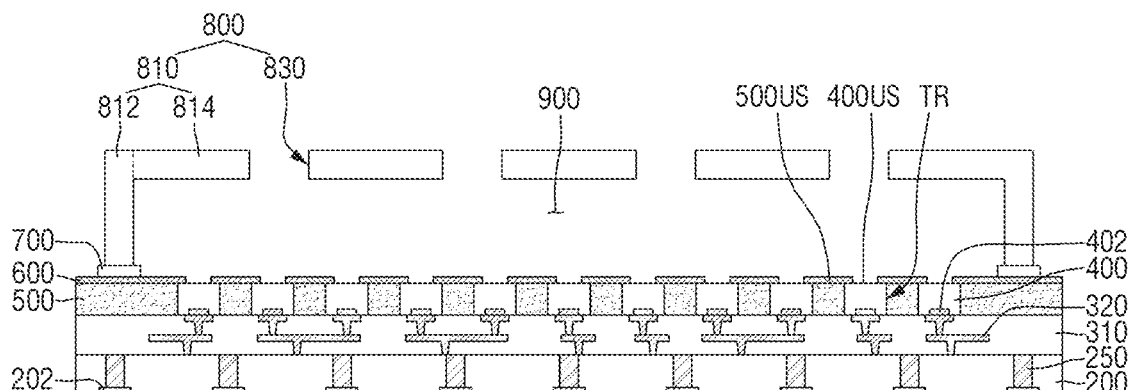

Referring to FIG. 7E, an adhesive layer 700 may be formed on the metal layer 600. The adhesive layer 700 may be formed on the edge region R2 of the silicon substrate 200. The adhesive layer 700 may be formed along the edge region R2 of the silicon substrate 200.

The temperature controller 800 may be formed on the silicon substrate 200. The temperature controller 800 may be attached and fixed to the adhesive layer 700. For example, the body 810 of the temperature controller 800 may be attached to the adhesive layer 700. The side wall 812 of the body 810 may be attached to the adhesive layer 700 and extend vertically. The top wall 814 of the body 810 may be connected to the side wall 812 of the body 810 to cover the plurality of dies 400. The temperature controller 800 may include a passage part 830. The passage part 830 may be formed on the top wall 814 of the body 810.

The body 810 may define a circulation region 900. The circulation region 900 may be a region in which a fluid that controls the temperature of the plurality of dies 400 circulates. The passage part 830 may be a passageway through which the fluid flows into or out of the circulation region 900. That is, the fluid may flow into the circulation region 900 through the passage part 830 to control the temperature of the plurality of dies 400. After that, the fluid may be discharged to the outside through the passage part 830. Although not shown, the circuit board 100 may then be formed on the lower side of the silicon substrate 200.

Figure 8:
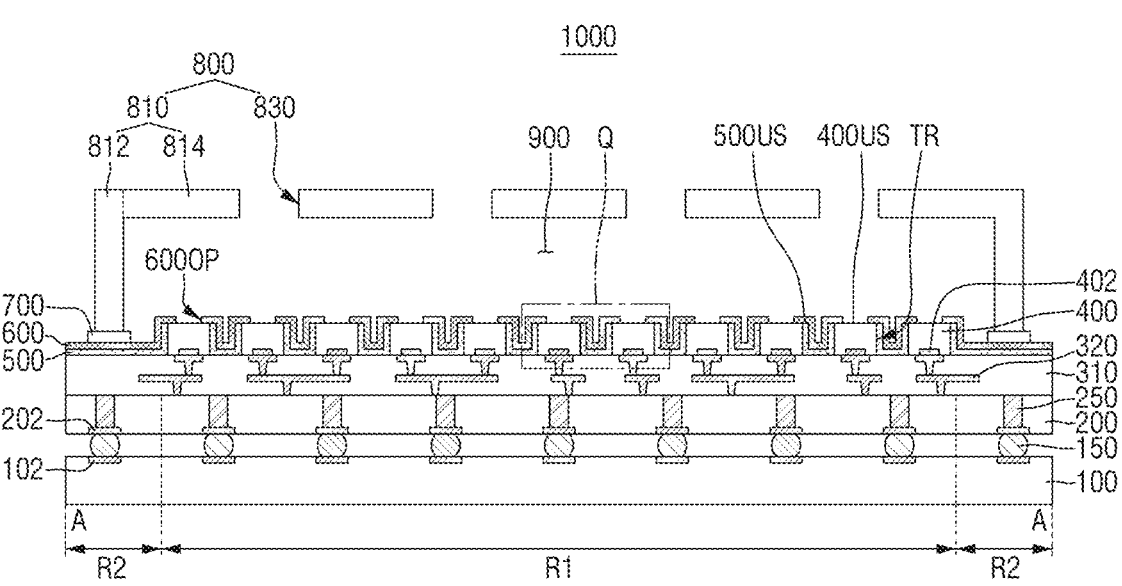
FIG. 8 is an exemplary cross-sectional view for explaining a semiconductor package structure according to some example embodiments.
Figure 9:
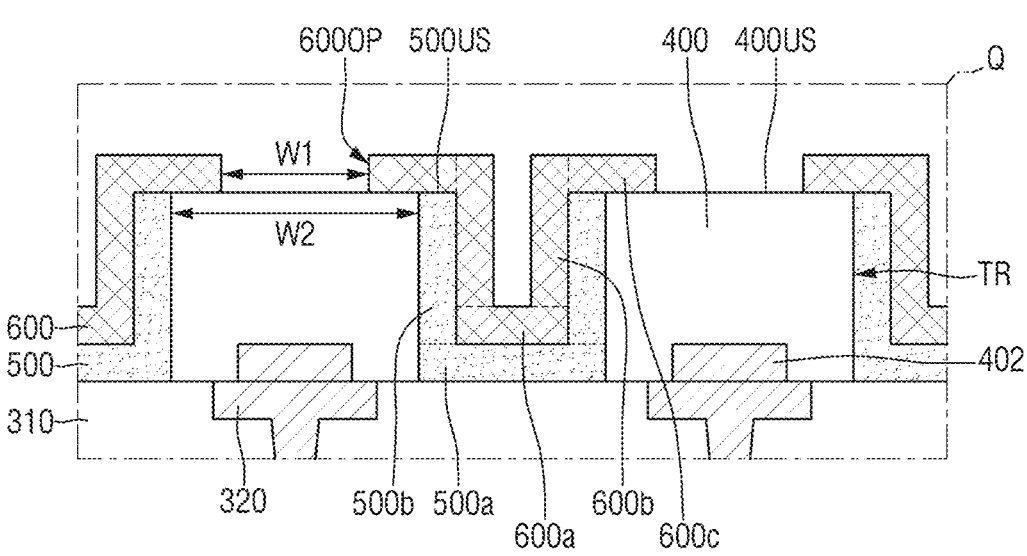
FIG. 9 is an enlarged view of a region Q of FIG. 8.

FIG. 8 is an exemplary cross-sectional view for explaining a semiconductor package structure according to some example embodiments. FIG. 9 is an enlarged view of a region Q of FIG. 8.

The semiconductor package structure 1000 according to some example embodiments will be described referring to FIGS. 8 and 9. For convenience of explanation, repeated explanation of contents explained using FIGS. 1 to 4 will not be provided.

Referring to FIGS. 8 and 9, the mold layer 500 is not completely filled between the plurality of dies 400. For example, the mold layer 500 may have a cup shape.

In some example embodiments, the mold layer 500 may include a first portion 500a and a second portion 500b. The first portion 500a of the mold layer 500 may be a portion extending horizontally. The second portion 500b of the mold layer 500 may be a portion extending vertically. The first portion 500a of the mold layer 500 may extend along the upper side of the redistribution substrate 310. The second portion 500b of the mold layer 500 may extend along side walls of the die 400. The upper side 500US of the mold layer 500 may be an upper side of the second portion 500b of the mold layer 500. The upper side 500US of the mold layer 500 may be placed on the same plane as the upper side 400US of the die 400. In other words, the upper side 500US and the upper side 400US may have the same height.

In some example embodiments, the trench TR may be defined by the second portion 500b of the mold layer 500. Each of the plurality of dies 400 may be placed in the trench TR.

In some example embodiments, the metal layer 600 may extend conformally along the upper side 500US of the mold layer 500, the upper side 400US of the die 400, the side wall of the second portion 500b of the mold layer 500, and the upper side of the first portion 500a of the mold layer 500. The metal layer 600 may have, for example, a cup shape.

For example, the metal layer 600 may include a first portion 600a, a second portion 600b, and a third portion 600c. The first portion 600a of the metal layer 600 may be a portion that extends along the upper side of the first portion 500a of the mold layer 500. The first portion 600a of the metal layer 600 may extend horizontally. The second portion 600b of the metal layer 600 may be a portion that extends along the side wall of the second portion 500b of the mold layer 500. The second portion 600b of the metal layer 600 may extend vertically. The third portion 600c of the metal layer 600 may be a portion that extends along the upper side 500US of the mold layer 500 and the upper side 400US of the die 400. The third portion 600c of the metal layer 600 may extend horizontally.

The third portion 600c of the metal layer 600 covers a part of the upper side 400US of the die 400. The third portion 600c of the metal layer 600 exposes a part of the upper side 400US of the die 400. The third portion 600c of the metal layer 600 covers the upper side 500US of the mold layer 500. At least a part of the second portion 600b of the metal layer 600 may horizontally overlap the die 400. The first portion 600a of the metal layer 600 may horizontally overlap the die 400.

Some dies among the plurality of dies 400 may require the electromagnetic wave shielding. The dies that require the electromagnetic wave shielding may be shielded from electromagnetic waves by the first portion 600a and the second portion 600b of the metal layer 600.

In some example embodiments, the adhesive layer 700 may be attached to the first portion 600a of the metal layer 600. The adhesive layer 700 may horizontally overlap the die 400. Also, a part of the side wall 812 of the body 810 may horizontally overlap the die 400.

FIGS. 10A to 10H are cross-sectional views sequentially showing processes for fabricating the semiconductor package structure having the cross-section of FIG. 8. A method for fabricating the semiconductor package structure according to some example embodiments will be described referring to FIGS. 10A to 10H.

Figure 10A:
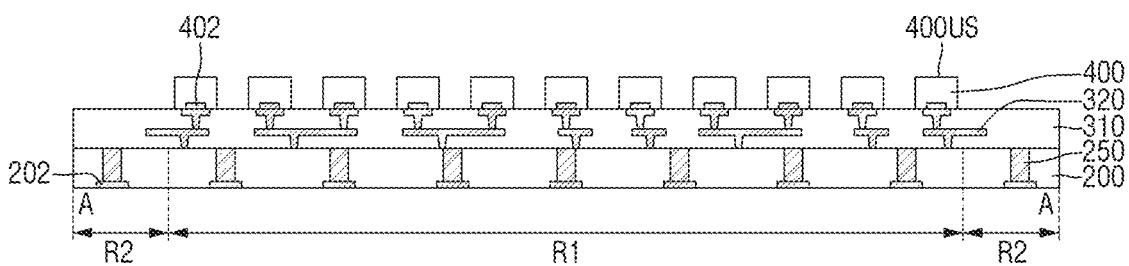
FIGS. 10A to 10H are cross-sectional views sequentially showing processes for fabricating the semiconductor package structure having the cross-section of FIG. 8.

Referring to FIG. 10A first, the silicon substrate 200 may be provided. The second substrate pad 202 may be formed inside the silicon substrate 200. The second substrate pad 202 may expose the lower side of the silicon substrate 200.

The redistribution substrate 310 may be formed on the silicon substrate 200. The redistribution patterns 320 may be formed inside the redistribution substrate 310. A plurality of dies 400 may be mounted on the redistribution substrate 310. The plurality of dies 400 may be mounted on the center region R1 of the silicon substrate 200. Each of the plurality of dies 400 may include a chip pad 402. The chip pad 402 may be bonded to the redistribution patterns 320. That is, the plurality of dies 400 may be electrically connected to the redistribution patterns 320.

Figure 10B:
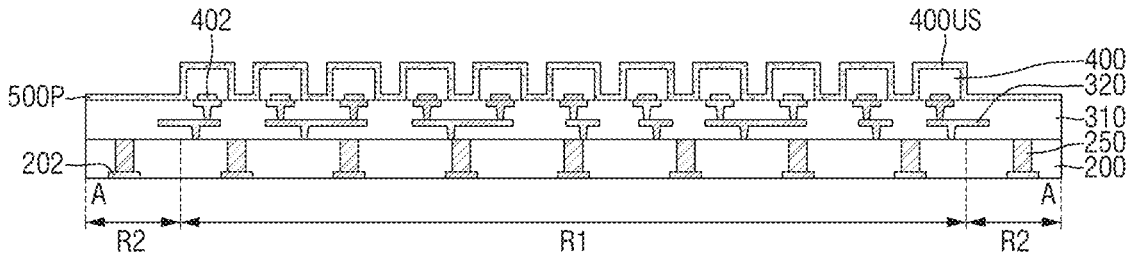

Referring to FIG. 10B, a pre-mold layer 500P may be formed. The pre-mold layer 500P may be formed (e.g., conformally) along the upper side of the redistribution substrate 310, the side walls of the die 400, and the upper side 400US of the die 400. The pre-mold layer 500P may include, for example, but not limited to, an insulating polymeric material such as an EMC.

Figure 10C:
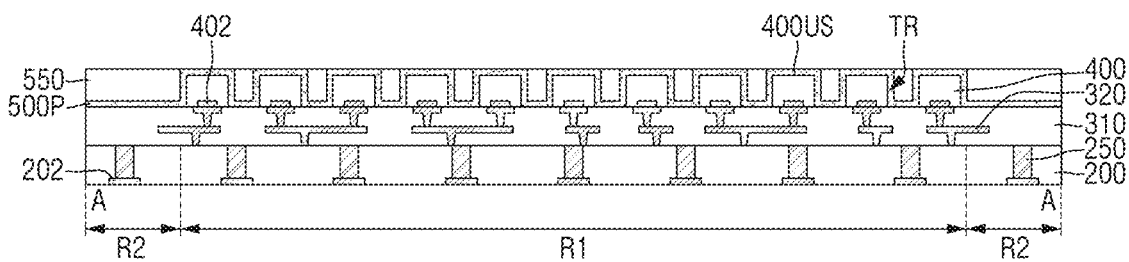

Referring to FIG. 10C, a sacrificial layer 550 may be formed. The sacrificial layer 550 may fill the spaces between the pre-mold layers 500P. The upper side of the sacrificial layer 550 and the upper side of the pre-mold layer 500P may be placed on the same plane. The sacrificial layer 550 may include an easily removable material, such as a silicon oxide film and/or a silicon oxynitride film. The sacrificial layer 550 may be removed after the mold layer 500 is formed.

Figure 10D:
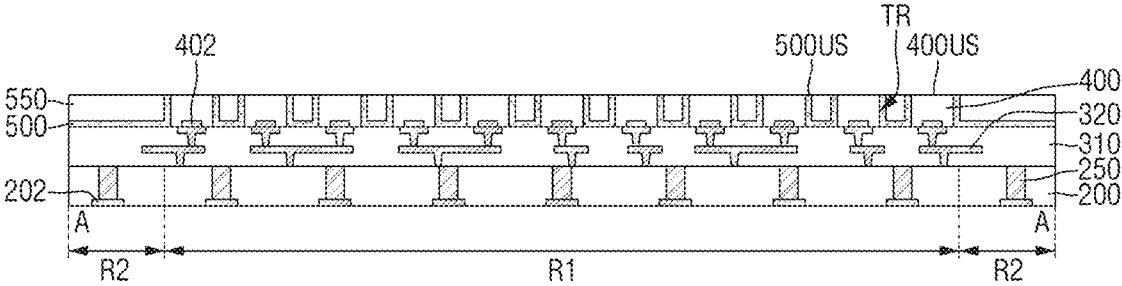

Referring to FIG. 10D, a part of the pre-mold layer 500P may be removed to form the mold layer 500. A part of the pre-mold layer 500P may be removed to expose the upper side 400US of the die 400. The upper side 400US of the die 400 may be placed on the same plane as the upper side 500US of the mold layer 500. A part of the sacrificial layer 550 may also be removed in the process of removing a part of the pre-mold layer 500P.

Figure 10E:
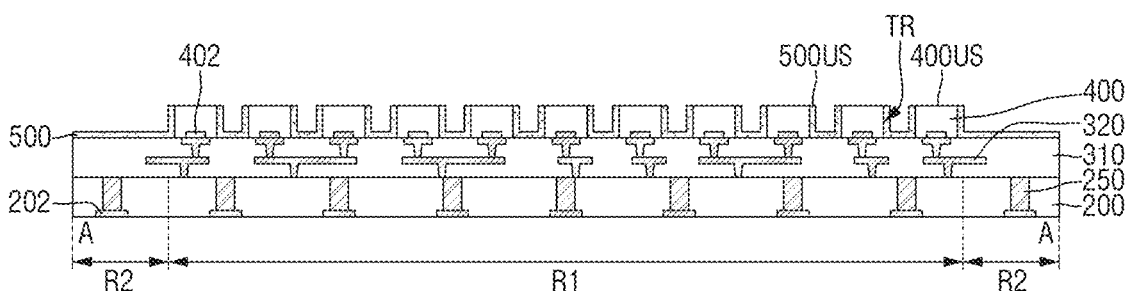

Referring to FIG. 10E, the sacrificial layer 550 may be removed. The sacrificial layer 550 may be removed to expose the surface of the mold layer 500.

Figure 10F:
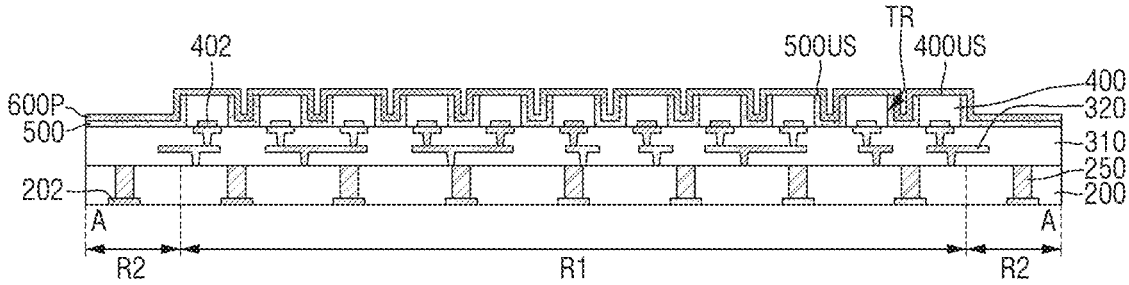

Referring to FIG. 10F, a pre-metal layer 600P may be formed along the surface of the mold layer 500 and the upper side of the die 400. The pre-metal layer 600P may be conformally formed along the surface of the mold layer 500 and the upper side of the die 400. A part of the pre-metal layer 600P may horizontally overlap the die 400. A part of the pre-metal layer 600P may horizontally overlap the mold layer 500.

The pre-metal layer 600P may include a conductive material. For example, the pre-metal layer 600P may be formed of copper (Cu), nickel (Ni), aluminum (Al), and combinations thereof. Preferably, the pre-metal layer 600P may be formed of, but not limited to, copper (Cu).

Figure 10G:
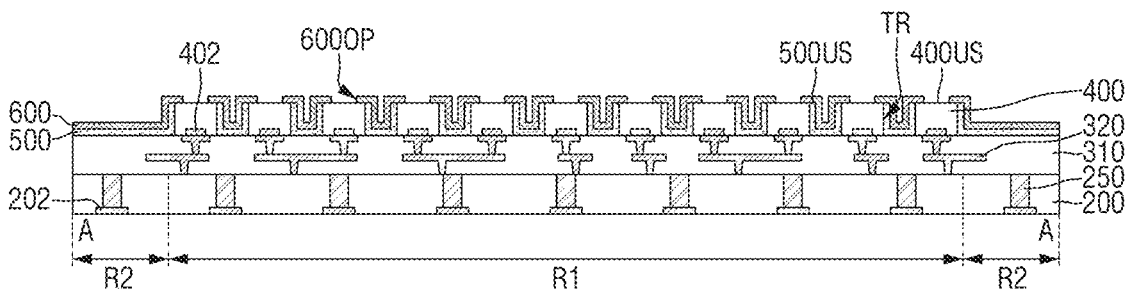

Referring to FIG. 10G, a part of the pre-metal layer 600P may be removed to form the metal layer 600. A part of the pre-metal layer 600P may be removed to form the opening 600OP. The opening 600OP may expose a part of the upper side 400US of the die 400. The metal layer 600 may expose a part of the upper side 400US of the die 400. The metal layer 600 may cover a part of the upper side 400US of the die 400. The metal layer 600 may completely cover the upper side 500US of the mold layer 500. The metal layer 600 may completely cover the surface of the mold layer 500.

Figure 10H:
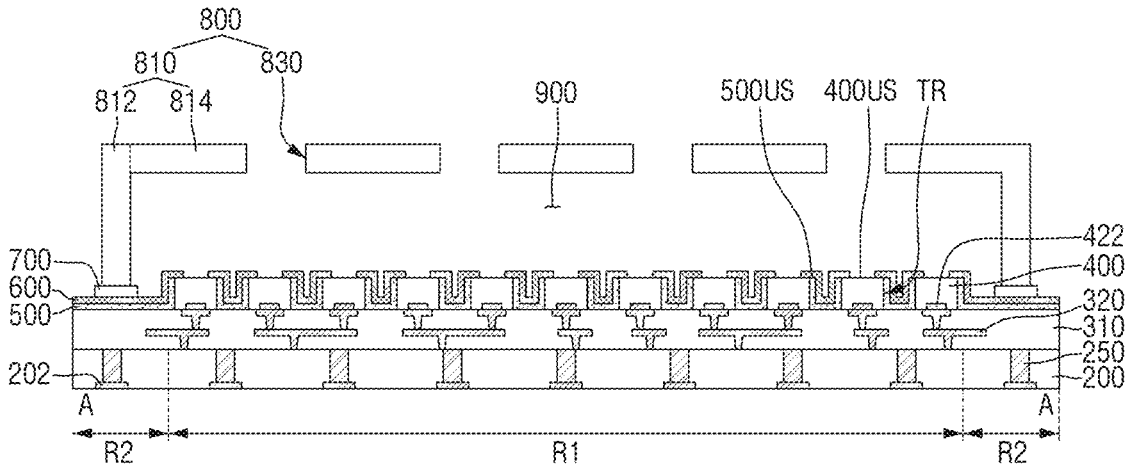

Referring to FIG. 10H, an adhesive layer 700 may be formed on the metal layer 600. The adhesive layer 700 may be formed in the edge region R2 of the silicon substrate 200. The adhesive layer 700 may be formed along the edge region R2 of the silicon substrate 200. The adhesive layer 700 may horizontally overlap the die 400. The adhesive layer 700 may horizontally overlap at least a part of the mold layer 500. That is, the level of the bottom side of the adhesive layer 700 may be different from the level of the upper side 400US of the die 400.

The temperature controller 800 may be formed on the silicon substrate 200. The temperature controller 800 may be attached and fixed to the adhesive layer 700. For example, the body 810 of the temperature controller 800 may be attached to the adhesive layer 700. The side wall 812 of the body 810 may be attached to the adhesive layer 700 and extend vertically. At least a part of the side wall 812 of the body 810 may horizontally overlap the die 400. At least a part of the side wall 812 of the body 810 may horizontally overlap at least a part of the mold layer 500. The top wall 814 of the body 810 may be connected to the side wall 812 of the body 810 to cover the plurality of dies 400. The temperature controller 800 may include a passage part 830. The passage part 830 may be formed on the top wall 814 of the body 810.

The body 810 may define a circulation region 900. The circulation region 900 may be a region in which a fluid that controls the temperature of the plurality of dies 400 circulates. The passage part 830 may be a passageway through which the fluid flows into or out of the circulation region 900. That is, the fluid may flow into the circulation region 900 through the passage part 830 to control the temperature of the plurality of dies 400. After that, the fluid may be discharged to the outside through the passage part 830.

Figure 11:
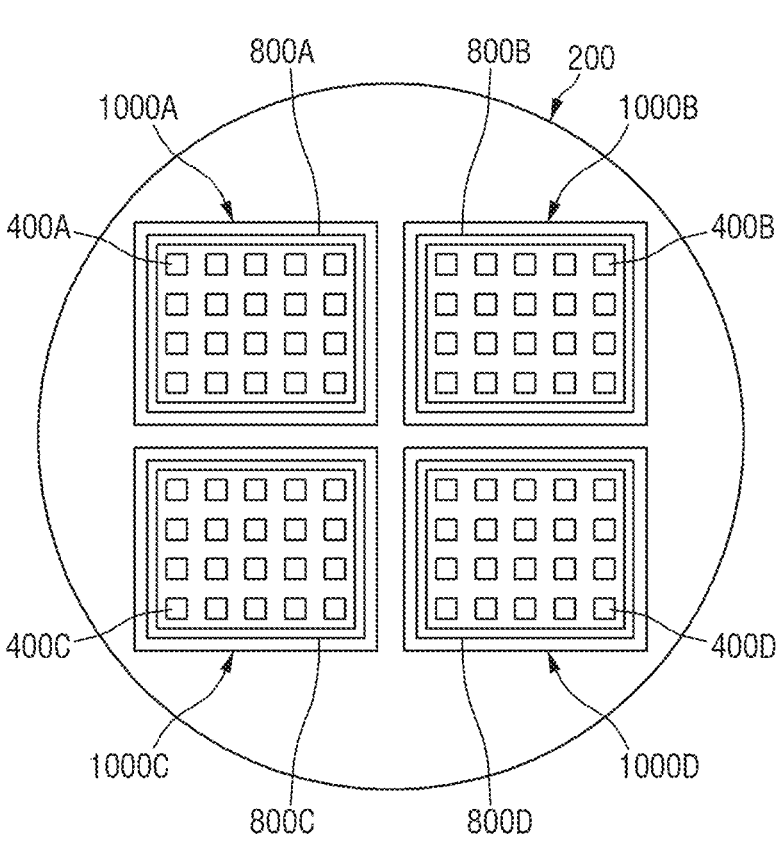
FIG. 11 is an exemplary plan view for explaining a semiconductor package structure according to some example embodiments.

FIG. 11 is an exemplary plan view for explaining a semiconductor package structure according to some example embodiments.

Referring to FIG. 11, a semiconductor package structure 2000 according to some example embodiments may include a first structure 1000A, a second structure 1000B, a third structure 1000C and a fourth structure 1000D. A plurality of structures 1000A, 1000B, 1000C, and 1000D may be formed on the silicon substrate 200. After that, each of the plurality of structures 1000A, 1000B, 1000C, and 1000D may be cut.

The first structure 1000A may include a plurality of first dies 400A and first temperature controllers 800A. The first temperature controller 800A may cover the first dies 400A. The first temperature controllers 800A may control the temperature of the first dies 400A. The second structure 1000B may include a plurality of second dies 400B and second temperature controllers 800B. The second temperature controller 800B may cover the second dies 400B. The second temperature controller 800B may control the temperature of the second dies 400B. The third structure 1000C may include a plurality of third dies 400C and third temperature controllers 800C. The third temperature controller 800C may cover the third dies 400C. The third temperature controller 800C may control the temperature of the third dies 400C. The fourth structure 1000D may include a plurality of fourth dies 400D and fourth temperature controllers 800D. The fourth temperature controller 800D may cover the fourth dies 400D. The fourth temperature controller 800D may control the temperature of the fourth dies 400D.

The first to fourth dies 400A, 400B, 400C and 400D may be the same as the die 400 described using FIGS. 1 to 4, and the first to fourth temperature controllers 800A, 800B, 800C and 800C may be the same as the temperature controller 800 described using FIGS. 1 to 4.

Figure 12:
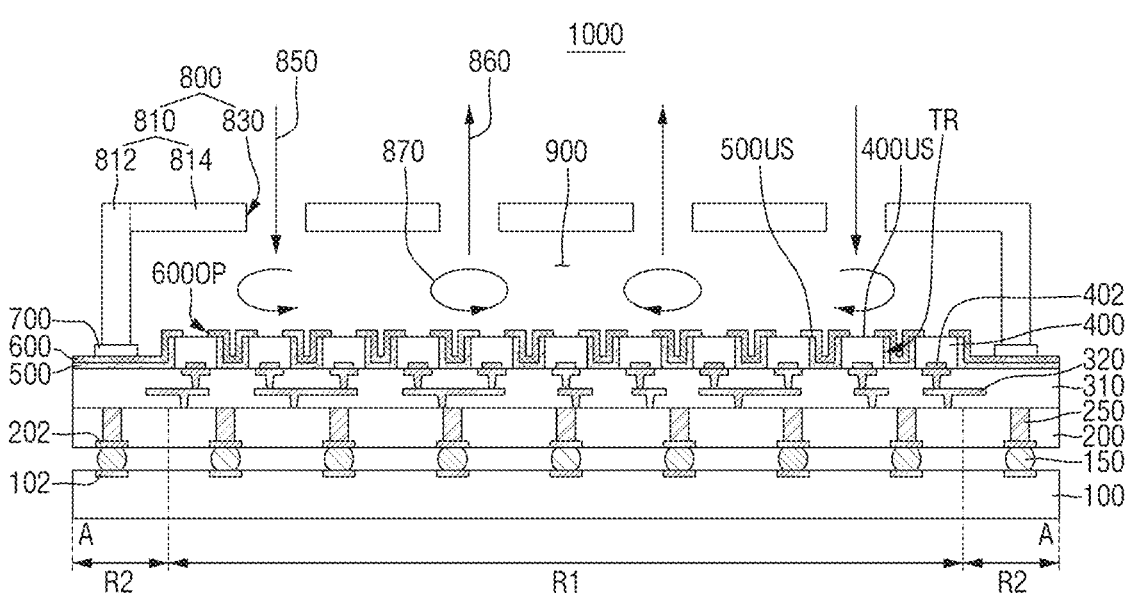
FIG. 12 is a conceptual diagram for explaining the method for controlling the die temperature using the semiconductor package structure according to some example embodiments.

A method for adjusting the die temperature using the semiconductor package structure according to some example embodiments will be described below. FIG. 12 is a conceptual diagram for explaining the method for controlling the die temperature using the semiconductor package structure according to some example embodiments.

Referring to FIG. 12, the fluid may flow into the passage part 830 of the temperature controller 800 (see reference numeral 850). The fluid may be supplied to the circulation region 900. The fluid may circulate in the circulation region 900 (see reference numeral 870). In an example, the fluid may circulate in the circulation region 900, while rotating clockwise or counterclockwise.

The fluid may come into direct contact with the upper sides 400US of the plurality of dies 400. The fluid may come into direct contact with the upper sides 400US of the plurality of dies 400 to control the temperature of the dies 400. For example, the plurality of dies 400 may be cooled, using fluid having a relatively low temperature. At least a part of the metal layer 600 may cover a part of the upper side 400US of the plurality of dies 400. Therefore, the fluid may not penetrate inside the mold layer 500. A semiconductor package structure having improved reliability can be fabricated accordingly.

The fluid that has circulated in the circulation region 900 and controlled the temperature of the die 400 may be discharged through the passage part 830 (see reference numeral 860). By repeating such processes, the temperature controller 800 may control the temperature of the die 400.

Although FIG. 12 shows that the fluid flows in through the outermost passage part 830 (see reference numeral 850), and the fluid is discharged through the central passage part 830 (see reference numeral 860), the technical idea of the present disclosure is not limited thereto.

In concluding the detailed description, those skilled in the art will appreciate that many variations and modifications may be made to the example embodiments without substantially departing from the principles of the present disclosure. Therefore, the disclosed example embodiments of the disclosure are used in a generic and descriptive sense only and not for purposes of limitation.

What is claimed is:

1. A semiconductor package structure comprising:
a silicon substrate;
a plurality of dies on the silicon substrate;
a mold layer between the plurality of dies;
a metal layer covering an upper side of the mold layer and at least a part of upper sides of each of the plurality of dies, the metal layer including an opening exposing a part of the upper side of at least one die among the plurality of dies; and
a temperature controller configured to control a temperature of the plurality of dies, on the mold layer,
the temperature controller including
a body which defines a circulation region configured to circulate a fluid for controlling the temperature of the plurality of dies, and
a passage part configured to allow the fluid to flow into or out of the circulation region, and
the fluid in the circulation region being in direct contact with exposed upper sides of the plurality of dies.

2. The semiconductor package structure of claim 1, wherein a width of the opening is smaller than a width of the at least one die.

3. The semiconductor package structure of claim 1, wherein a width of the opening is same as a width of the at least one die.

4. The semiconductor package structure of claim 1, wherein the metal layer completely covers the upper side of at least one of the plurality of dies.

5. The semiconductor package structure of claim 1, wherein the upper side of the mold layer and the upper side of the at least one die are placed on a same plane.

6. The semiconductor package structure of claim 1, wherein a part of the metal layer overlaps the at least one die in a horizontal direction.

7. The semiconductor package structure of claim 6, wherein the mold layer includes a first portion extending in the horizontal direction, and a second portion extending along a side wall of the at least one die.

8. The semiconductor package structure of claim 1, further comprising:
redistribution patterns between the silicon substrate and the plurality of dies,
wherein each of the plurality of dies includes a chip pad in direct contact with the redistribution patterns.

9. The semiconductor package structure of claim 1, wherein each of the plurality of dies includes at least one of a memory chip and a logic chip.

10. The semiconductor package structure of claim 1, wherein at least a part of the passage part of the temperature controller overlaps the opening of the metal layer in a vertical direction.

11. The semiconductor package structure of claim 1, further comprising:
a circuit board below the silicon substrate.

12. A semiconductor package structure comprising:
a silicon substrate which has a circular shape from a planar viewpoint, and includes a center region and an edge region that surrounds the center region;
a mold layer on a front side of the silicon substrate, and including a plurality of trenches in the center region of the silicon substrate;
a plurality of dies inside the plurality of trenches;
a metal layer covering the mold layer, and including an opening that exposes a part of upper sides of the plurality of dies; and
a temperature controller on the silicon substrate and configured to control a temperature of the plurality of dies,
the temperature controller including
an adhesive layer attached to the metal layer and on an edge region of the silicon substrate,

15 a body connected to the adhesive layer, defining a circulation region configured to circulate a fluid for controlling the temperature of the plurality of dies, and the body having a columnar shape, and a passage part on a top wall of the body, and configured to allow the fluid to flow into or out of the circulation region, and the fluid in the circulation region being in direct contact with the upper sides of the plurality of dies to control the temperature of the plurality of dies.

13. The semiconductor package structure of claim 12, wherein a width of the opening is smaller than a width of a respective one of the plurality of dies.

14. The semiconductor package structure of claim 12, wherein the metal layer completely covers the upper side of at least one of the plurality of dies.

15. The semiconductor package structure of claim 12, wherein an upper side of the mold layer and the upper side of at least one die of the plurality of dies are on a same plane.

16. The semiconductor package structure of claim 12, further comprising:

redistribution patterns between the silicon substrate and the plurality of dies, wherein each of the plurality of dies includes a chip pad in direct contact with the redistribution patterns.

17. The semiconductor package structure of claim 12, wherein each of the plurality of dies includes at least one of a memory chip and a logic chip.

18. The semiconductor package structure of claim 12, wherein at least a part of the passage part of the temperature controller overlaps the opening of the metal layer in a vertical direction.

19. A semiconductor package structure comprising:

a circuit board;

a silicon substrate electrically connected to the circuit board, the silicon substrate having a circular shape from a planar viewpoint, including a center region and an edge region that surrounds the center region, and being formed of silicon (Si);

a mold layer on a front side of the silicon substrate, and including a plurality of trenches in the center region of the silicon substrate;

a redistribution pattern between the silicon substrate and the mold layer;

a plurality of dies inside the plurality of trenches, and include chip pads bonded to the redistribution pattern;

a metal layer which covers the mold layer, the metal layer exposing at least a part of upper sides of the plurality of dies, and including an opening having a width smaller than a width of the plurality of dies; and a temperature controller placed on the silicon substrate and configured to control a temperature of the plurality of dies, the temperature controller including an adhesive layer attached to the metal layer and placed along an edge region of the silicon substrate, a body which includes a side wall and a top wall having a columnar shape, and defines a circulation region configured to circulate a fluid for controlling the temperature of the plurality of dies, the side wall of the body being connected to the adhesive layer, and a passage part on the top wall of the body and configured to allow the fluid to flow into or out of the circulation region, the fluid in the circulation region being in direct contact with the upper sides of the plurality of dies to control the temperature of the plurality of dies, and the upper sides of each of the plurality of dies and an upper side of the mold layer are on a same plane.

20. The semiconductor package structure of claim 19, wherein each of the plurality of dies includes at least one of a memory chip and a logic chip.

* * * * *